United States Patent
Yi

(10) Patent No.: US 6,215,837 B1
(45) Date of Patent: Apr. 10, 2001

(54) PIPE COUNTER SIGNAL GENERATOR PROCESSING DOUBLE DATA IN SEMICONDUCTOR DEVICE

(75) Inventor: Seung-Hyun Yi, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/471,382

(22) Filed: Dec. 22, 1999

(30) Foreign Application Priority Data

Dec. 24, 1998 (KR) ................................. 98/58597

(51) Int. Cl.[7] ....................................... G11C 8/04
(52) U.S. Cl. ............................... 377/26; 365/236
(58) Field of Search ........................... 377/26, 118, 119; 365/236, 233, 193

(56) References Cited

U.S. PATENT DOCUMENTS 6,026,054 * 2/2000 Lee ........................................ 365/236
6,147,926 * 11/2000 Park ...................................... 365/233

* cited by examiner

Primary Examiner—Tuan T. Lam
(74) Attorney, Agent, or Firm—Jacobson, Price, Holman & Stern, PLLC

(57) ABSTRACT

Disclosed is a DDR SDRAM device which may be implemented by simply modifying a pipe counter for an SDR SDRAM device. A pipe counter comprising according to the present invention comprises: a controller for producing a counter control signal in response to rising and falling edge signals of an external clock signal; an enabling unit for producing a plurality of enable signals in response to the counter control signal and for enabling one of the enable signals during one period of the counter control signal; and a driver for receiving one of the enable signals, producing first and second pipe counter signals being synchronized with the rising and falling edge signals of the external clock signal, wherein one of the first and second pipe counter signals is activated during one period of the received enable signal. The DDR SDRAM according to the present invention improves its operation speed without increasing the clock frequency and the bandwidth thereof, by providing the pipe counter controlling data output path.

4 Claims, 10 Drawing Sheets

PIPE COUNTER SIGNAL GENERATOR PROCESSING DOUBLE DATA IN SEMICONDUCTOR DEVICE

FIELD OF THE INVENTION

The present invention relates to a semiconductor memory device, and more particularly, to a semiconductor memory device capable of inputting and outputting a plurality of data within one period of a clock.

DESCRIPTION OF THE PRIOR ART

With the increase of data output bandwidth in semiconductor memory devices, the DDR (Double Data Rate) method of outputting double data at rising and falling edges of a clock signal has been required instead of the SDR (Single Data Rate) method of outputting data only at a rising edge. In implementing data input/output circuits in the DDR method, it is very difficult to double the operation speed in a memory core because the memory core does not have an operation timing margin enough. Accordingly, it is inevitable to take such a double data input/output in a two-bit prefetch method. Generally, the operation speed of the memory core in the two-bit prefetch method is the same as that in the SDR (Single Data Rate) method, but the two-bit prefetch method in such as a DDR method puts double data in a latch circuit, which is in the front of a pipe counter, and processes each data at the rising and falling edges of a clock signal from the pipe counter. In other words, when the data stored in memory cells are read out, the pipe counter determines the order of the data output before outputting the data through an output buffer.

FIG. 1 is a schematic diagram illustrating the conventional SDR SDRAM device. As shown in FIG. 1, the conventional SDR SDRAM device includes a cell array block 10, an NMOS transistor 11, a sense amplifier 12, a command decoder 13, a pipe counter 14, a pipe del signal generator 15, a pipeline latch circuit 16 and an output driver 17. In similar to typical DRAM devices, the NMOS transistor 111 transfers the data stored in the cell array block 10 to a pair of data bus lines db and dbb according to a bit line selection signal Yi, and the sense amplifier 12 amplifies the difference between the voltages on the data bus lines db and dbb and sends the amplified voltage difference through a global input/output line gio to the pipe del signal generator 15 and the pipeline latch circuit 16. The command decoder 13 produces instructions for a read operation and the pipeline latch circuit 16 stores the transferred data from the sense amplifier 12. The pipe counter 14 receives a read command from the command decoder 13, an internal rising clock signal rclk, a CAS latency signal cl2 indicating that the CAS latency is of 2, an output enable signal outen determining an output enable section in response to the read command and the CAS latency signal and a counter reset signal rst_pcnt_b to reset the pipeline latch circuit 16, thereby producing a pipe counter signal pcnt for outputting, in this order, the data stored in the pipeline latch circuit 16 in response to the internal rising clock signal rclk. The pipe del signal generator 15 senses data on the global input/output line gio and produces a pipe del signal notifying the pipeline latch circuit 16 that data exist on the global input/output line gio. The output driver 17 receives an output from the pipeline latch circuit 16 and then buffers the final data output.

As stated above, in the conventional SDR SDRAM device, the data output is synchronized only with the rising edge of the clock signal (i.e., internal rising clock signal rclk) and the pipeline latch circuit 16 stores the data through only one global input/output line gio. Particularly, to increase the operation speed of the SDRAM device employing the SDR method, the external clock speed should be increased. However, the increase of the external clock speed requires an increase of the operation speed of other devices in a system as well as the memory devices. Accordingly, speeding up the external clock signal may cause many problems in a system. Also, since current clock frequency is more than 100 MHz, the period may be in at most 10 nsec. In the conventional SDR SDRAM device, it is very difficult to process two subsequent data during this short period. In case where the pipe counter of the SDR SDRAM device, which performs the data output operation to be synchronized with an external clock signal, is employed in the DDR SDRAM device, it is necessary to provide a complicated pipe counter making different reset signals associated with an operation mode of the SDR SDRAM device. Furthermore, it is impossible to apply the pipe counter of the SDR SDRAM device to the DDR SDRAM device because it is required to make pipeline counter signals for controlling pipeline latch circuits at another edge of the clock signal. As a result, it is impossible to adapt the conventional SDR SDRAM device to a basic model of the DDR SDRAM device.

SUMMARY OF THE INVENTION

It is, therefore, an object of the present invention to provide a DDR SDRAM device having an improved pipe counter.

It is another abject of the present invention to provide a pipe counter for a DDR SDRAM device, by simply modifying a pipe counter for an SDR SDRAM device.

In accordance with another aspect of the present invention, there is provided a pipe counter comprising in a DDR SDRAM device, the pipe counter comprising: a controller for producing a counter control signal in response to rising and falling edge signals of an external clock signal; an enabling unit for producing a plurality of enable signals in response to the counter control signal and for enabling one of the enable signals during one period of the counter control signal; and a driver for receiving one of the enable signals, producing first and second pipe counter signals being synchronized with the rising and falling edge signals of the external clock signal, wherein one of the first and second pipe counter signals is activated during one period of the received enable signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, a DDR SDRAM device according to the present invention will be described in detail, referring to the accompanying drawings.

Figure 1:
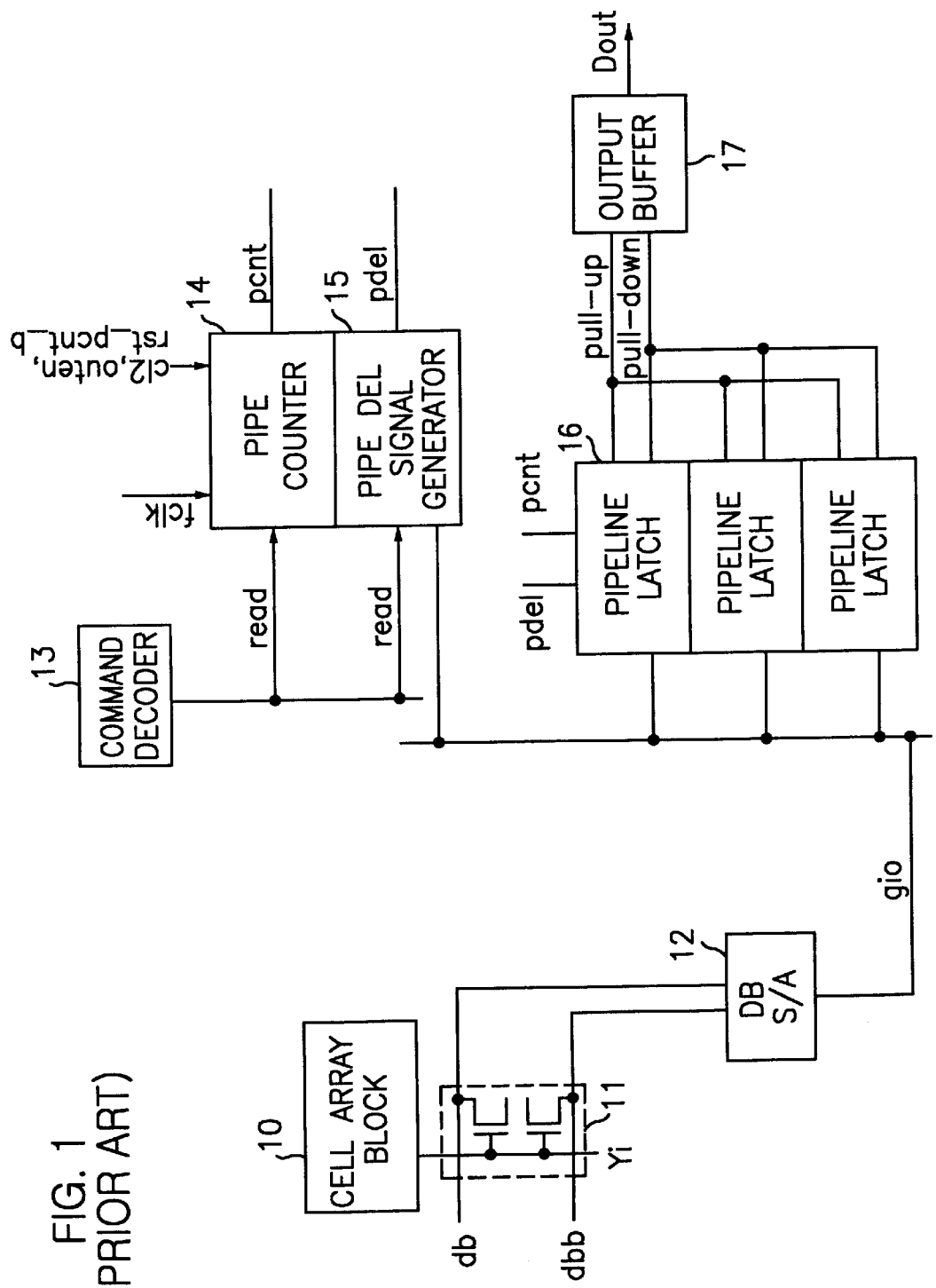
FIG. 1 is a schematic diagram illustrating the conventional SDR SDRAM device.
Figure 2:
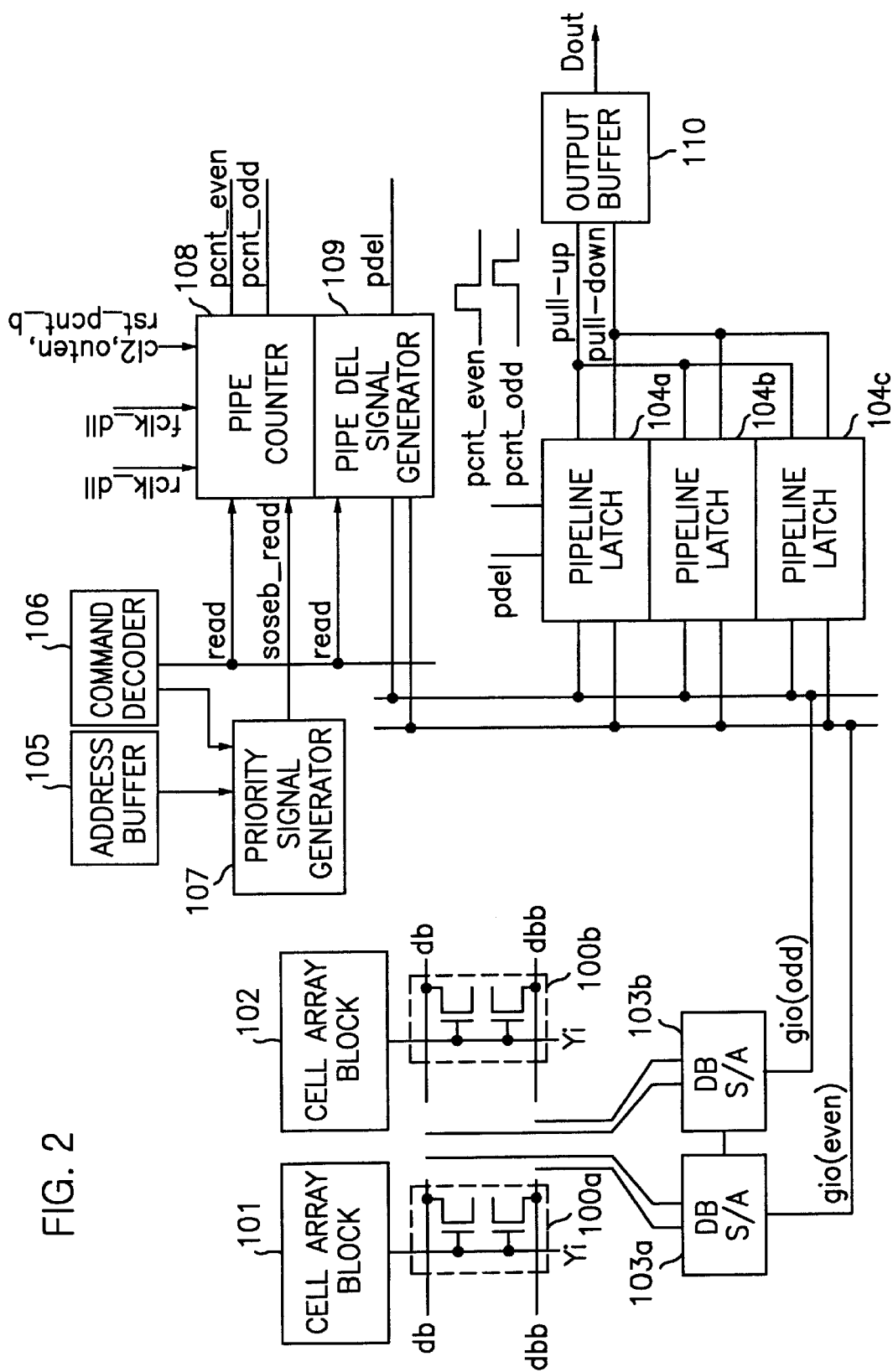
FIG. 2 is a schematic diagram illustrating a DDR SDRAM device according to the present invention.

Referring to FIG. 2, the DDR SDRAM device according to the present invention includes first and second cell array blocks 101 and 102, NMOS transistors 100a and 100b, sense amplifiers 103a and 103b, pipeline latch circuits 104a to 104c, an address buffer 105, a command decoder 106, a priority signal generator 107, a pipe counter 108, a pipe del signal generator 109 and an output buffer 110.

The first and second cell array blocks 101 and 102 are synchronized with an external clock signal and they are independently accessed by internal address signals. The NMOS transistors 100a and 100b transfer the data stored in the first and second cell array blocks 101 and 102 to a pair of data bus lines db and dbb according to a bit line selection signal Yi, respectively, and the sense amplifiers 103a and 103b amplify the difference between the voltages on the data bus lines db and dbb and send the amplified voltage difference through each global input/output line gio to the pipeline latch circuits 104a to 104c and the pipe del signal generator 109. The address buffer 105 produces internal address signals, by buffering the received external address signals. The priority signal generator 107 receives the address signals from the address buffer 105 and a read command from the command decoder 106 and then produces a priority control signal soseb_read determining the priority of data output. The pipeline latch circuits 104a to 104c store the transferred data from the sense amplifiers 103a and 103b and output, in this order, the stored data according to rising and falling edges of an external clock signal. The command decoder 106 produces a read command. Also, the pipe counter 108 receives a read command read from the command decoder 106, internal rising and falling clock signals rclk_dll and fclk_dll, a CAS latency signal c12 indicating that the CAS latency is of 2, an output enable signal outen determining a section of output enable in response to the read command and the CAS latency, a counter reset signal rst_$_{pcnt}$_b to reset the pipeline latch circuits 104a to 104c and the priority control signal soseb_read, thereby producing pipe counter signals pcnt_even and pcnt_odd for outputting, in this order, the data stored in the pipeline latch circuits 104a to 104c in response to the internal rising and falling clock signals rclk_dll and fclk_dll. The pipe del signal generator 109 senses data on the global input/output line gio and produces a pipe del signal pdel notifying the pipeline latch circuits 104a to 104c that data exist on the global input/output line gio. The output buffer 110 receives an output from the pipeline latch circuits 104a to 104c and then buffers the final data output.

Figure 3:
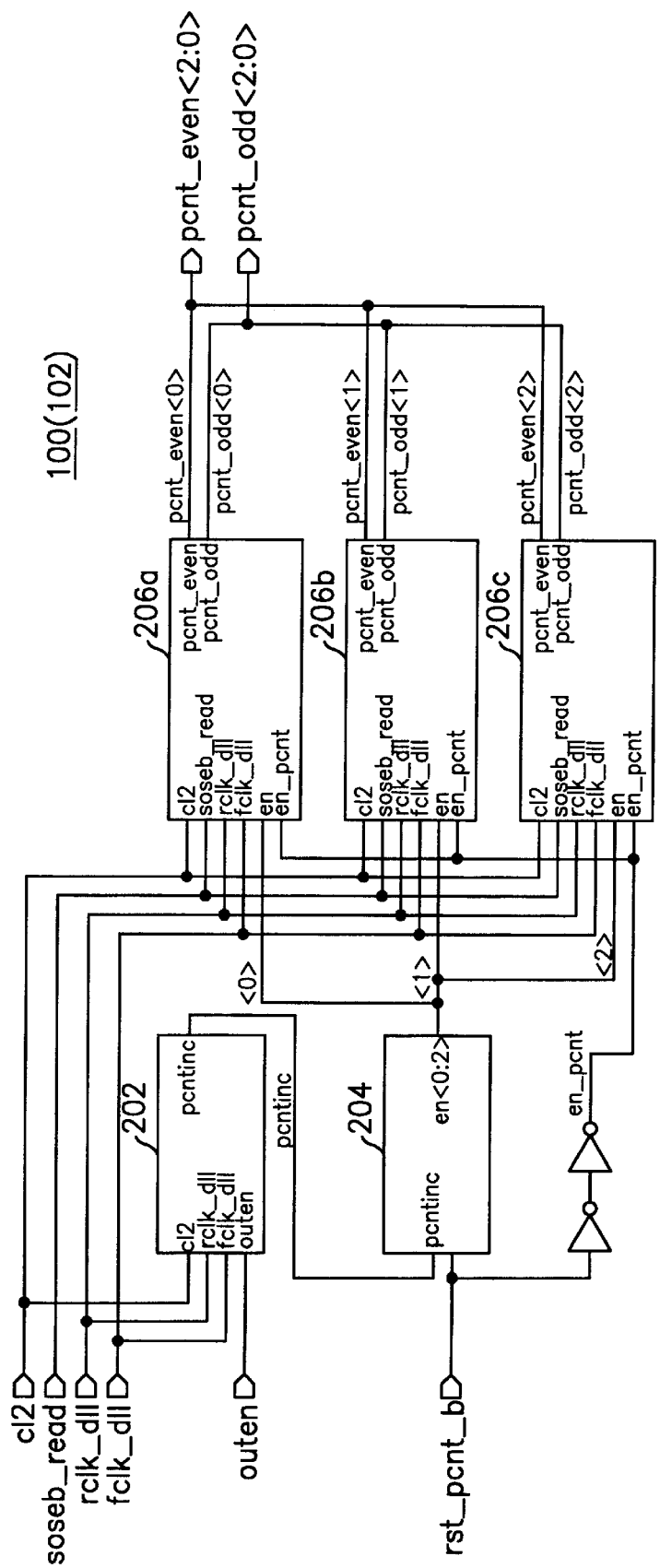
FIG. 3 is a schematic diagram illustrating a pipe counter according to the present invention.

Referring to FIG. 3, the pipe counter 108 of FIG. 2 includes a pipe counter controller 202, a pipe counter enable unit 204 and pipe counter signal drivers 206a, 206b and 206c.

The pipe counter controller 202, which is enabled by the output enable signal outen, receives the rising edge clock signal rclk_dll of a pulse synchronized with a rising edge of the external clock signal, the falling edge clock signal fclk_dll of a pulse synchronized with the falling edge of the external clock signal, and the CAS latency signal c12 and produces a pipe count control signal pcntinc for controlling the pipe counter enable unit 204. The pipe counter enable unit 204 receives the counter reset signal rst_pcnt_b and the pipe count control signal pcntinc from the pipe counter controller 202 and produces a counter enable signal en<0:2> to enable the pipe counter signal drivers 206a, 206b and 206c. Each of the pipe counter signal drivers 206a, 206b and 206c receives the counter enable signal en<0:2>, the CAS latency signal c12, the rising and falling edge clock signals rclk_dll and fclk_dll, the priority control signal soseb_read and a pipe line enable signal pcnt_en. The pipe line enable signal pcnt_en is created by delaying the counter reset signal rst_pcnt_b and reserves to enable the pipe counter signals pcnt_even and pcnt_odd. Accordingly, the pipe counter signal drivers 206a, 206b and 206c are synchronized with the rising and falling edge clock signals rclk_dll and fclk_dll within a period of one clock signal in order to output the pipe counter signals pcnt_even and pcnt_odd. The CAS latency signal c12 and the priority control signal soseb_read determine which one of the pipe counter signals pcnt_even and pcnt_odd is first activated.

Figure 4:
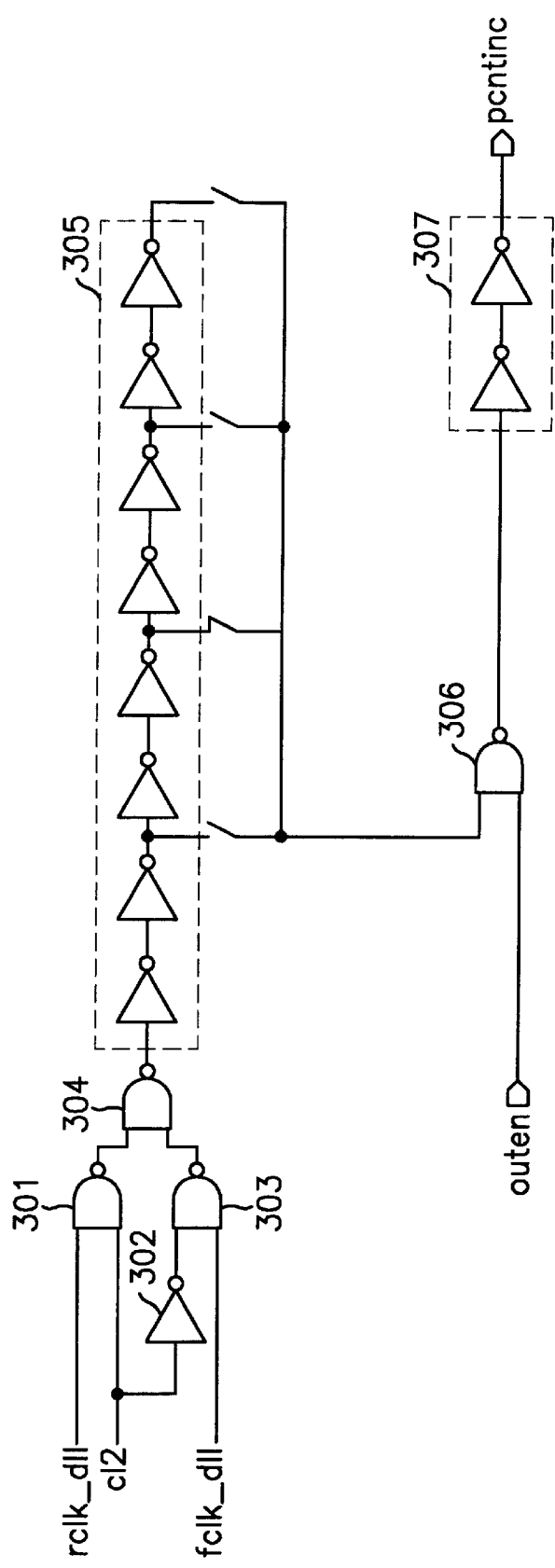
FIG. 4 is a circuit diagram illustrating a pipe counter controller according to the present invention.

Referring to FIG. 4, the pipe counter controller 202 includes a NAND gate 301 receiving the rising edge clock signal rclk_dll and the CAS latency signal c12, a NAND gate 303 receiving the falling edge clock signal fclk_dll and the inverted CAS latency signal c12 through an inverter 302, a NAND gate 304 receiving outputs from the NAND gates 301 and 303, a delayer 305 having a plurality of inverters to delay an output from the NAND gate 301, a NAND gate 306 NANDing an output from the NAND gate 304, which is delayed by the delayer 305 according to a predetermined option, and the output enable signal outen, and a delayer 307 delaying an output from the NAND gate 306. The CAS latency signal c12 selects one of the rising and falling edge clock signals rclk_dll and fclk_dll and, while the output enable signal outen is activated in a high level, the pipe count control signal pcntinc is produced by the selected rising or falling edge clock signal rclk_dll or fclk_dll.

Figure 5:
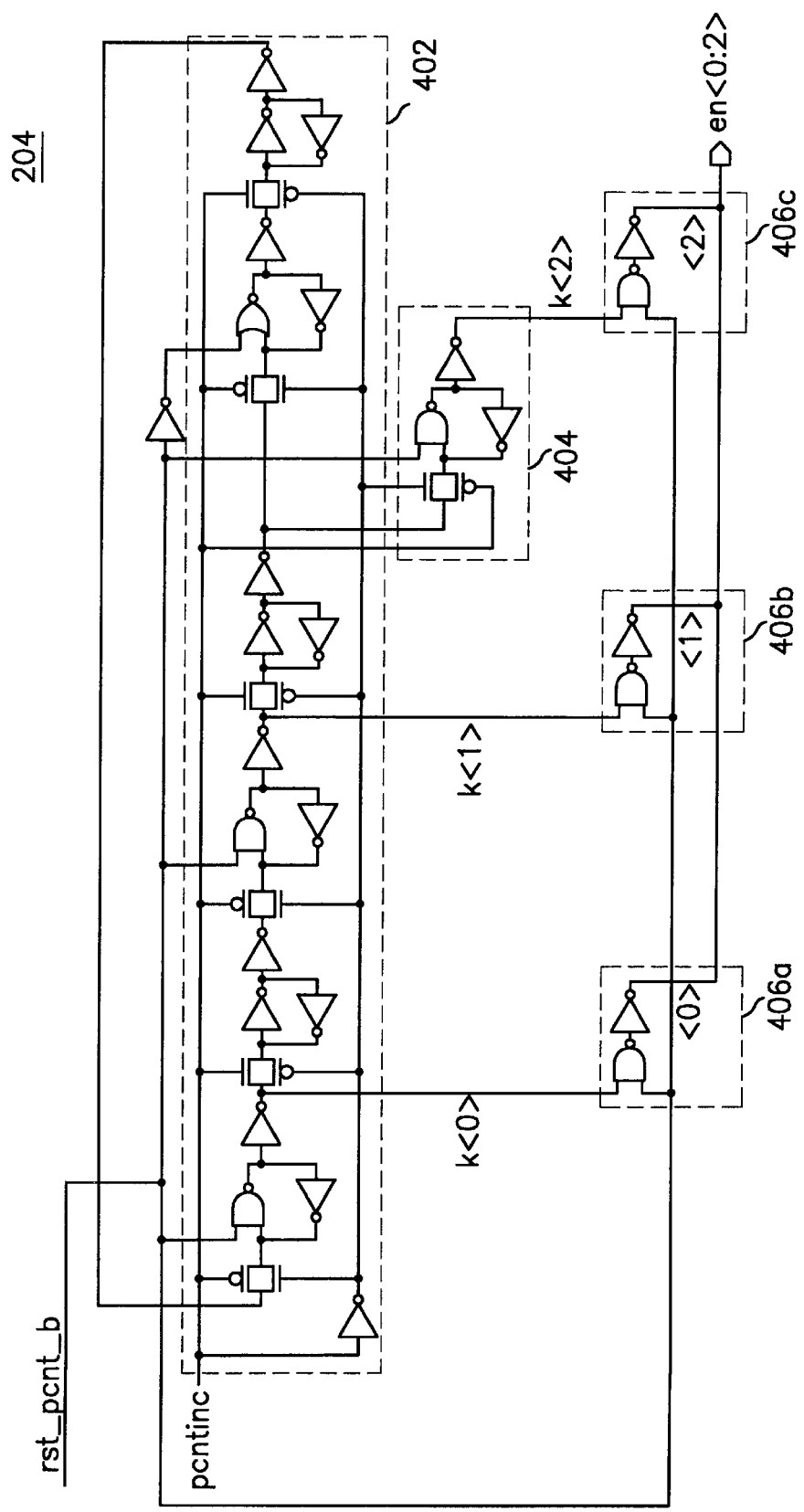
FIG. 5 is a circuit diagram illustrating a pipe counter enable unit according to the present invention.

Referring to FIG. 5, the pipe counter enable unit 204 includes a binary counter 402 having a plurality of stages receiving the counter reset signal rst_pcnt_b and the pipe count control signal pcntinc, a supplementary latch circuit 404 receiving an output from the fourth stage in the binary counter 402 under the control of the pipe count control signal pcntinc, and a plurality of output stages 406a to 406c. The first output stage 406a receives an output signal k<0> from the first stage of the binary counter 402 and the counter reset signal rst_pcnt_b to produce a first counter enable signal en<0>, the second output stage 406b receives an output signal k<1> from the third stage of the binary counter 402 and the counter reset signal rst_pcnt_b to produce a second counter enable signal en<1>, and the third output stage 406c receives an output signal k<2> from the supplementary latch circuit 404 and the counter reset signal rst_pcnt_b to produce a third counter enable signal en<2>. When the counter reset signal rst_pcnt_b is in a low level, outputs of NAND gates in the binary counter 402 are in a high level and then the first to third counter enable signals en<0:2> are in a low level. Further, the fifth stage in the binary counter 402 has a NOR gate and an output from the NOR gate is in a low level at the time of resetting the binary counter 402, so that the fourth stage of the binary counter 402 latches a low state. Subsequently, when the pipe counter signal pcntinc is input into the binary counter 402, the first to third counter enable signals en<0:2> are, in this order, activated in a high level. At this time, if one of the first to third counter enable signals en<b:2> is activated, other enable signals are not activated.

Figure 6:
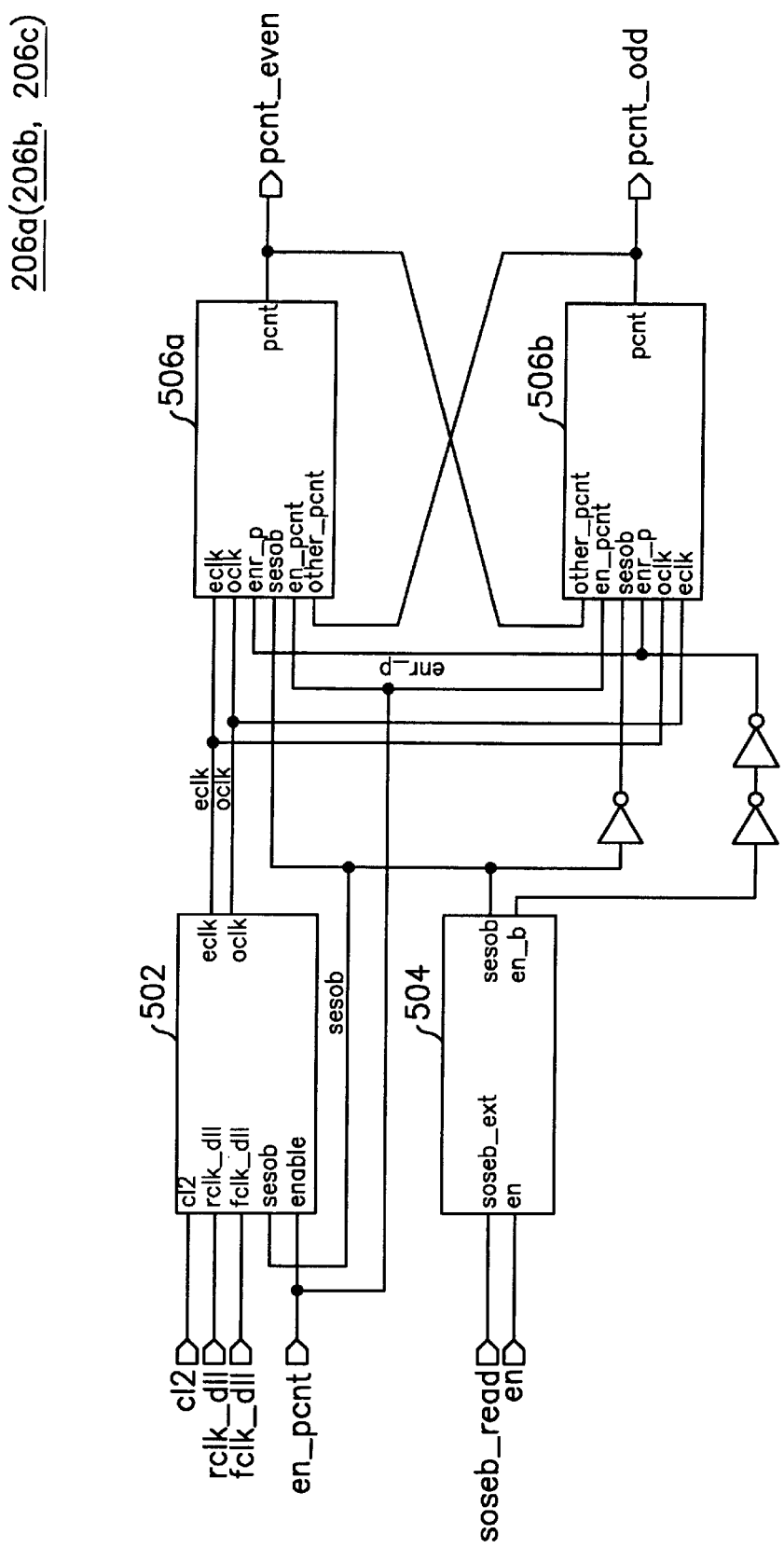
FIG. 6 is a circuit diagram illustrating a pipe counter signal driver according to the present invention.

Referring to FIG. 6, each of the pipe counter signal drivers 206a, 206b and 206c includes a clock selection unit 502, a priority control signal latch unit 504 and first and second pipe counter output units 506a and 506b. The priority control signal latch unit 504 receives the priority control signal soseb_read and one of the first to third counter enable signals en<0:2> and produces a secondary priority control signal soseb. The clock selection unit 502 receives the CAS latency signal c12, the rising and falling edge clock signals rclk_dll and fclk_dll, the secondary priority control signal soseb and the driver enable signal en_pcnt issued when the read operation is carried out and produces first and second clock signals eclk and oclk. Accordingly, one of the first and second clock signals eclk and oclk is selected by the secondary priority control signal soseb. Also, the first pipe counter output unit 506a receives the first and second clock signals eclk and oclk, the driver enable signal en_pcnt, the secondary priority control signal soseb and an output signal of the second pipe counter output unit 506b and produces a first pipe counter signal pcnt_even. In similar to the first pipe counter output unit 506a, the second pipe counter output unit 506b receives the first and second clock signals eclk and oclk, the driver enable signal en_pcnt, an inverted secondary priority control signal soseb and the first pipe counter signal pcnt_even from the first pipe counter output unit 506a and produces a second pipe counter signal pcnt_odd.

Figure 7:
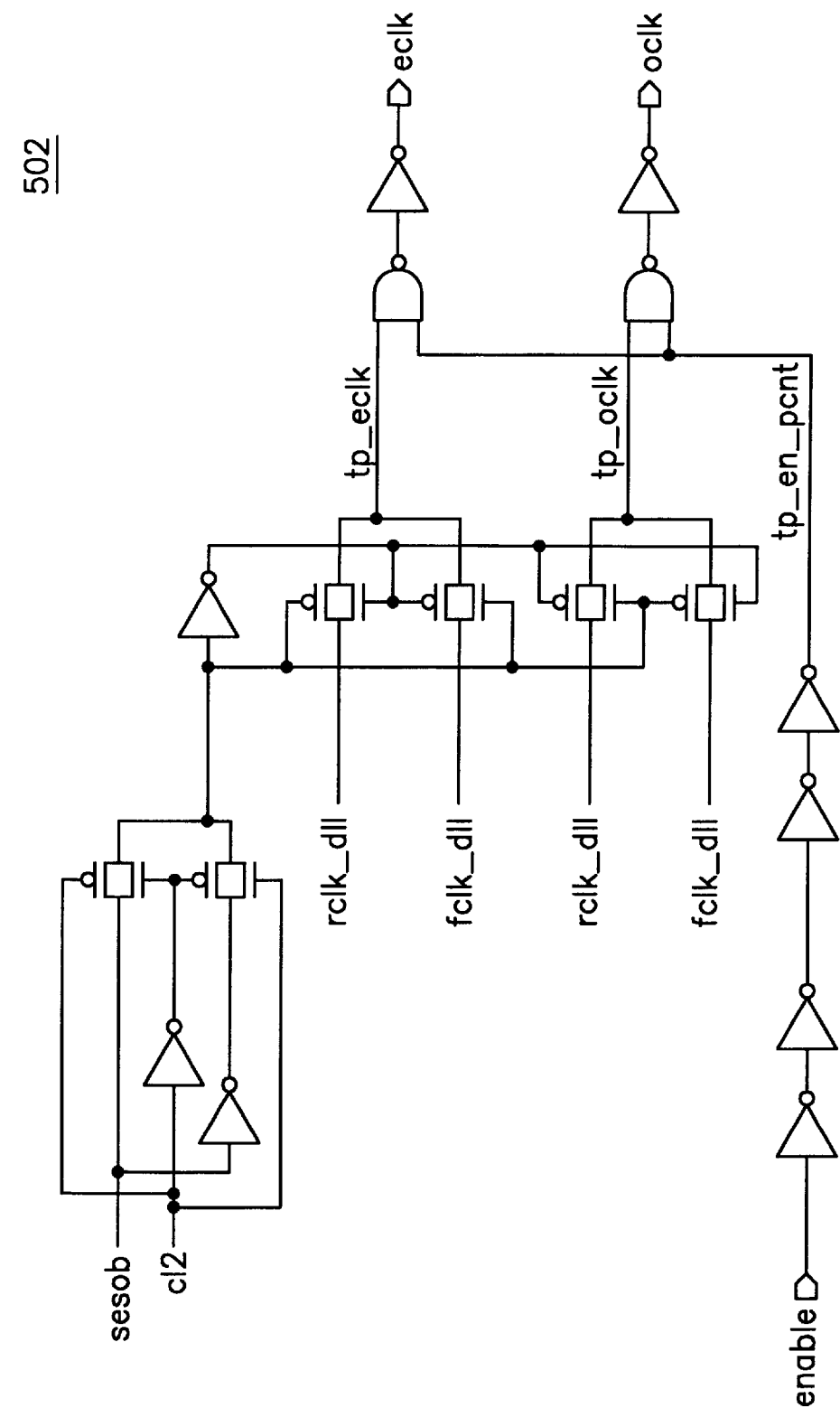
FIG. 7 is a circuit diagram illustrating a clock selection unit according to the present invention.

Referring to FIG. 7, the clock selection unit 502 selects one from the rising and falling edge clock signals rclk_dll and fclk_dll in response to the priority control signal soseb_read and the CAS latency signal c12 and outputs the first clock signal eclk or the second clock signal eclk. That is, in the case where the priority control signal soseb_read and the CAS latency signal c12 are in the same logic level, the rising edge clock signal rclk_dll is output as the first clock signal eclk and the falling edge clock signal fclk_dll is output as the second clock signal oclk. On the contrary, in the case where the priority control signal soseb_read and the CAS latency signal c12 are different from each other in logic level, the rising edge clock signal rclk_dll is output as the second clock signal oclk and the falling edge clock signal fclk_dll is output as the first clock signal eclk.

Figure 8:
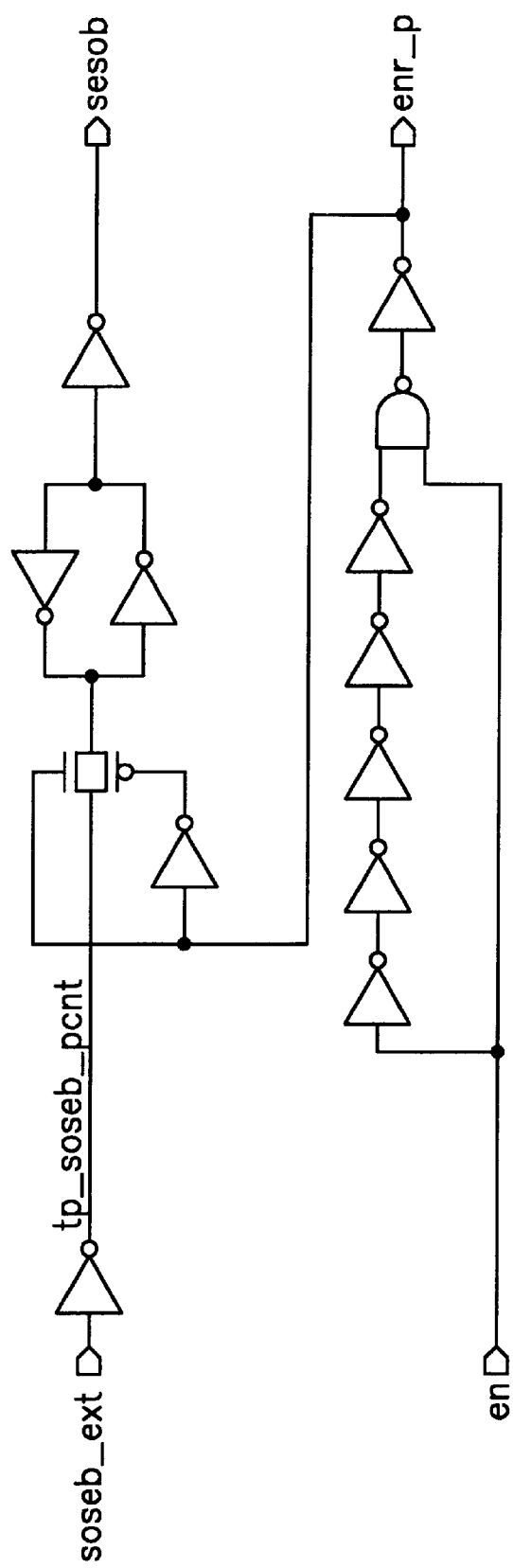
FIG. 8 is a circuit diagram illustrating a latch circuit for latching a priority control signal according to the present invention.

Referring to FIG. 8, the priority control signal latch unit 504 receives the counter enable signal en and delays it in order to produce a modified enable pulse signal enr_p. Furthermore, when the counter enable signal en is input into the priority control signal latch unit 504, the priority control signal latch unit 504 latches and delays the priority control signal soseb_read to produce the secondary priority control signal soseb for controlling the first and second pipe counter output units 506a and 506b.

Figure 9:
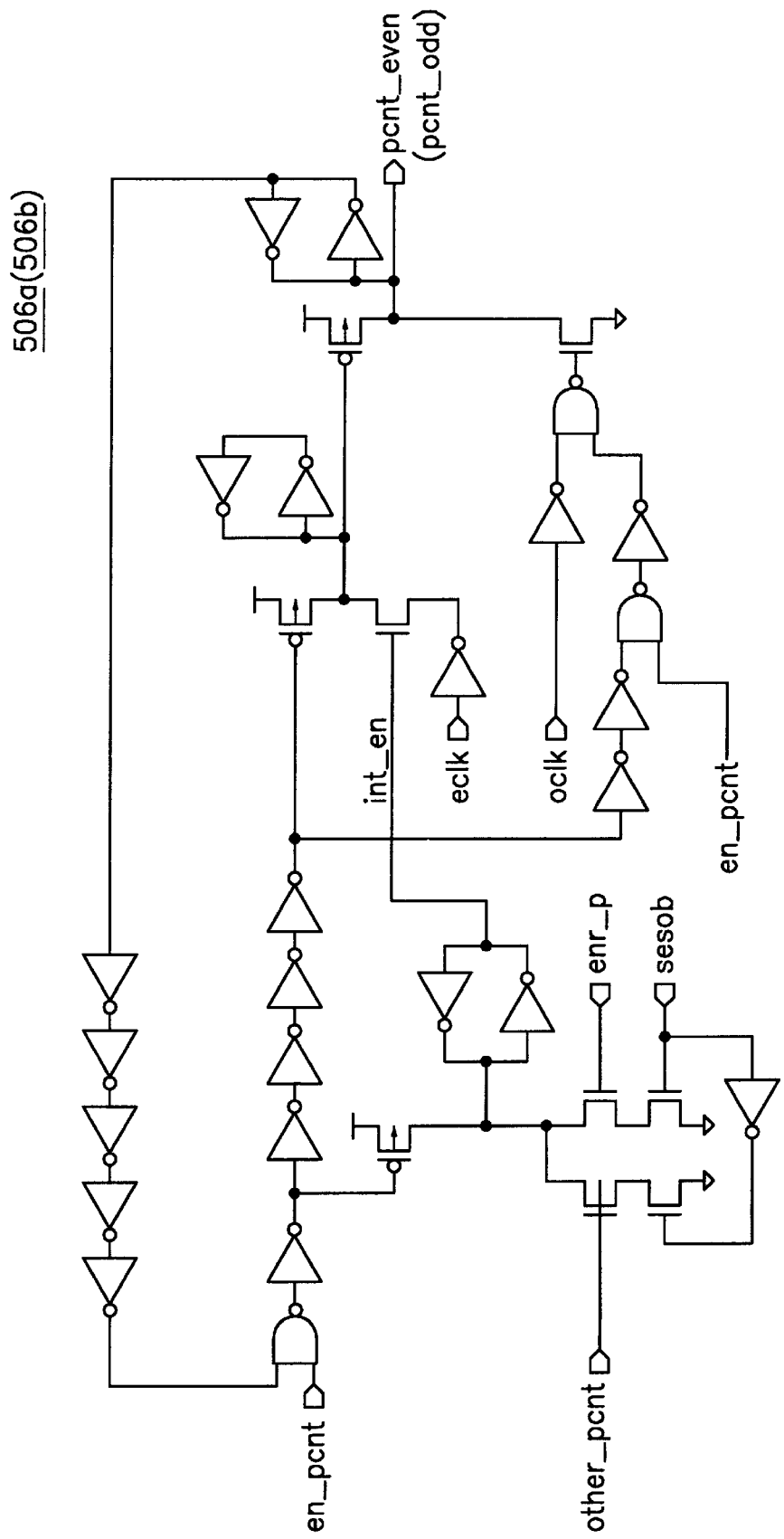
FIG. 9 is a circuit diagram illustrating an output unit for the pipe counter signal according to the present invention.

Referring to FIG. 9, each of the first and second pipe counter output units 506a and 506b is controlled by the driver enable signal en_pcnt, which is formed by delaying the counter reset signal rst_pcnt b. That is, while the driver enable signal en_pcnt is in a high level, if both the driver enable signal en_pcnt and the secondary priority control signal soseb, which are produced by the priority control signal latch unit 504, are in a high level, a node int_en is latched in a high level. At this time, if the first clock signal eclk is activated in a high level, the pipe counter signal pcnt_even is output.

Referring again to FIG. 6, the first pipe counter output unit 506a directly receives the secondary priority control signal soseb from the priority control signal latch unit 504, but the second pipe counter output unit 506b receives the inverted secondary priority control signal soseb. Also, the first and second pipe counter output units 506a and 506b are crosscoupled to each other in their input/output terminals and then, if one of them starts and produces an output thereof, the other starts in response to the output. Accordingly, when one of the first and second clock signals eclk and oclk is activated in a high level, the output signal of the pipe counter is generated. One of the first and second counter output units 506a and 506b produces the output thereof during the first half of one period of the external clock signal, and than the other generates an output thereof during the rest half period.

Figure 10:
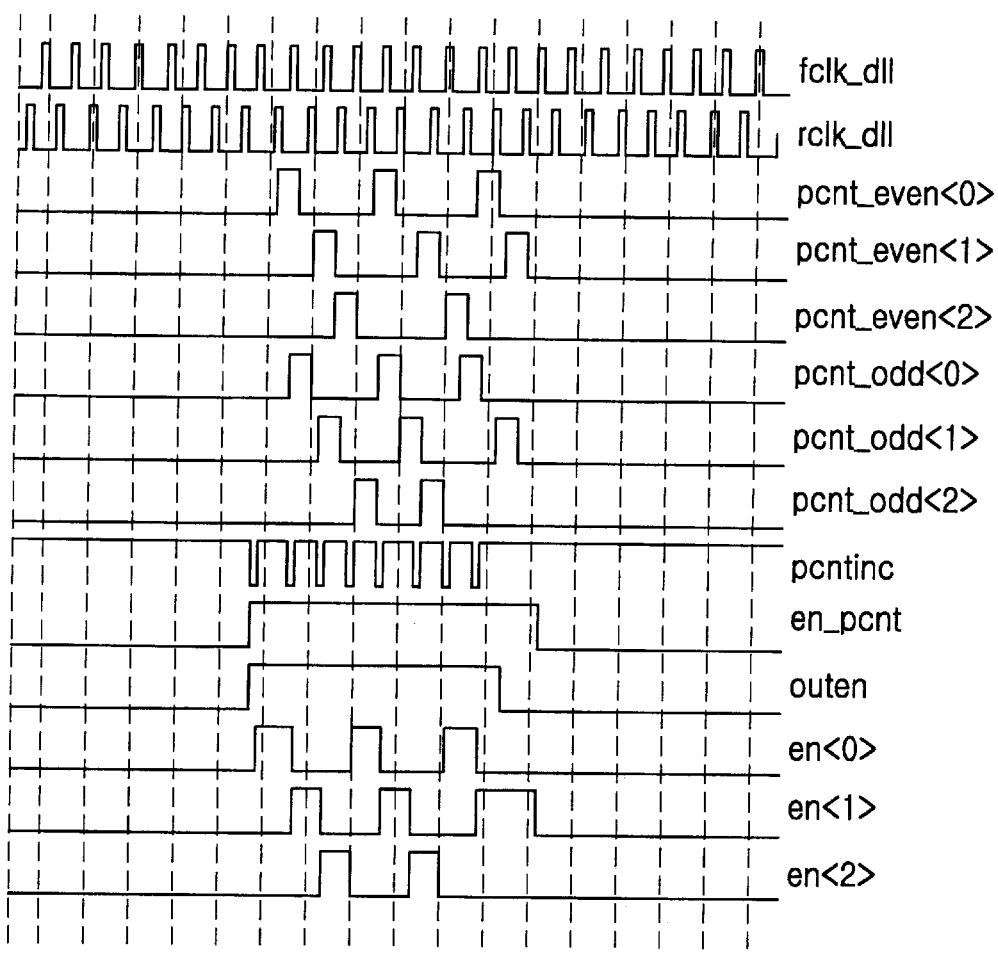
FIG. 10 is a timing chart of the pipe counter according to the present invention.

Referring to FIG. 10, when the output enable signal outen is in high level, the pipe count control signal pcntinc is generated. Also, it should be noted that the pipe count control signal pcntinc is selected from the rising and falling edge clock signals rclk_dll and fclk_dll in response to the CAS latency signal c12 and the pipe count control signal pcntinc and the selected rising or falling edge clock signal are out of phase.

On the other hand, the pipe counter enable unit 204 is reset by the counter reset signal rst_pcnt_b so that the first to third counter enable signals en<0:2> are in a low level. At this time, the first to third counter enable signals en<0>, en<1> and en<2> are, in this order, output in a high level whenever the pipe count control signal pcntinc is input into the pipe counter enable unit 204 and then it is in a low level. The first to third counter enable signals en<0:2> maintains a high level during one period of the external clock signal and the pipe counter signal drivers 206a, 206b and 206c receiving the first to third counter enable signals en<0:2> outputs a pair of the pipe counter signals pcnt_evev and pcnt_odd. The order of output between the pipe counter signals pcnt_evev and pcnt_odd is determined by the priority control signal soseb_read and the CAS latency signal c12.

As described above, the DDR SDRAM according to the present invention improves its operation speed without increasing the clock frequency and the bandwidth thereof, by providing the pipe counter controlling data output path.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A pipe counter contained in a DDR SDRAM device, comprising:
    a controller for producing a counter control signal in response to rising and falling edge signals of an external clock signal;
    an enabling unit for producing a plurality of enable signals in response to the counter control signal and for enabling one of the enable signals during one period of the counter control signal; and
    a driver for receiving one of the enable signals, producing first and second pipe counter signals being synchronized with the rising and falling edge signals of the external clock signal, wherein one of the first and second pipe counter signals is activated during one period of the received enable signal.

2. The pipe counter as recited in claim 1, wherein the controller selects one from a plurality of clock signals being synchronized with the rising and falling edge signals of the external clock signal and produces the counter control signal by inverting a phase of the selected clock signal.

3. The pipe counter as recited in claim 1, wherein the enabling unit comprises:

a binary counter including odd numbers of counting stages, which are, in series, coupled to each other, and wherein each counting stage includes a latch circuit and a transfer gate, wherein a high level signal from a final stage of the binary counter is transferred to a first stage of the binary counter and wherein an output from the first stage is propagated to the final stage whenever the counter control signal is activated;

a latch circuit in parallel coupled to the final stage of the binary counter for latching an output from a previous stage; and an output means for outputting an output from the latch circuit and an output from each counting stage except for the final stage of the binary counter.

4. The pipe counter as recited in claim 1, wherein the driver comprises:

a clock selection unit for receiving the rising and falling edge signals of the external clock signal from an external circuit, selecting one from the rising and falling edge signals and outputting the selected signal as a first clock signal or a second clock signal;

a priority control signal latch unit for receiving and delaying the enable signals and outputting a modified pulse based on the enable signals, wherein the priority control signal latch unit receives and latches a priority control signal for selecting the rising edge signal or the falling edge signal of the external clock signal; and an output unit for outputting the first and second pipe counter signals in response to an output from the priority control signal latch unit when one of first and second clock signals is activated.

* * * * *